(12) United States Patent
Lee

(10) Patent No.: US 7,687,341 B2
(45) Date of Patent: Mar. 30, 2010

(54) METHOD FOR FABRICATING SEMICONDUCTOR DEVICE

(75) Inventor: Min-Suk Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 38 days.

(21) Appl. No.: 12/006,142

(22) Filed: Dec. 31, 2007

(65) Prior Publication Data

US 2008/0311735 A1    Dec. 18, 2008

(30) Foreign Application Priority Data

Jun. 12, 2007    (KR)  ................ 10-2007-0057277

(51) Int. Cl.
     *H01L 21/336*    (2006.01)
     *H01L 21/8234*    (2006.01)
     *H01L 21/8238*    (2006.01)
     *H01L 21/8244*    (2006.01)

(52) U.S. Cl. ............... 438/199; 438/197; 438/201; 438/211; 438/241; 438/257; 257/E21.627; 257/E21.632; 257/E21.645; 257/E21.646

(58) Field of Classification Search ......... 257/E21.627, 257/E21.632, E21.645
See application file for complete search history.

(56) References Cited

U.S. PATENT DOCUMENTS 5,874,330 A * 2/1999 Ahn ................ 438/230
6,579,757 B2 * 6/2003 Kim et al. ............ 438/241
7,417,281 B2 * 8/2008 Sugimae et al. ......... 257/316
2003/0003673 A1 * 1/2003 Kim et al. ............ 438/315
2006/0051964 A1 * 3/2006 Xia et al. ............. 438/706
2008/0081451 A1 * 4/2008 Kim ................. 438/591

FOREIGN PATENT DOCUMENTS

| KR | 1999-0080277 | | 11/1999 |
|---|---|---|---|
| KR | 2001-0004237 | A | 1/2001 |
| KR | 2001-0091776 | A | 10/2001 |
| KR | 2003-0001913 | A | 1/2003 |

* cited by examiner

*Primary Examiner*—Charles D Garber
*Assistant Examiner*—Mohsen Ahmadi
(74) *Attorney, Agent, or Firm*—Blakely, Sokoloff, Taylor & Zafman

(57) ABSTRACT

A method for fabricating a semiconductor device includes forming at least one gate pattern over a substrate, forming a first insulation layer over the gate patterns and the substrate, etching the first insulation layer in a peripheral region to form at least one gate pattern spacer in the peripheral region, forming a second insulation layer over the substrate structure, etching the second insulation layer in a cell region to a given thickness, forming an insulation structure over the substrate structure, and etching the insulation structure, the etched first insulation layer and second insulation layer in the cell region to form a contact hole.

22 Claims, 9 Drawing Sheets

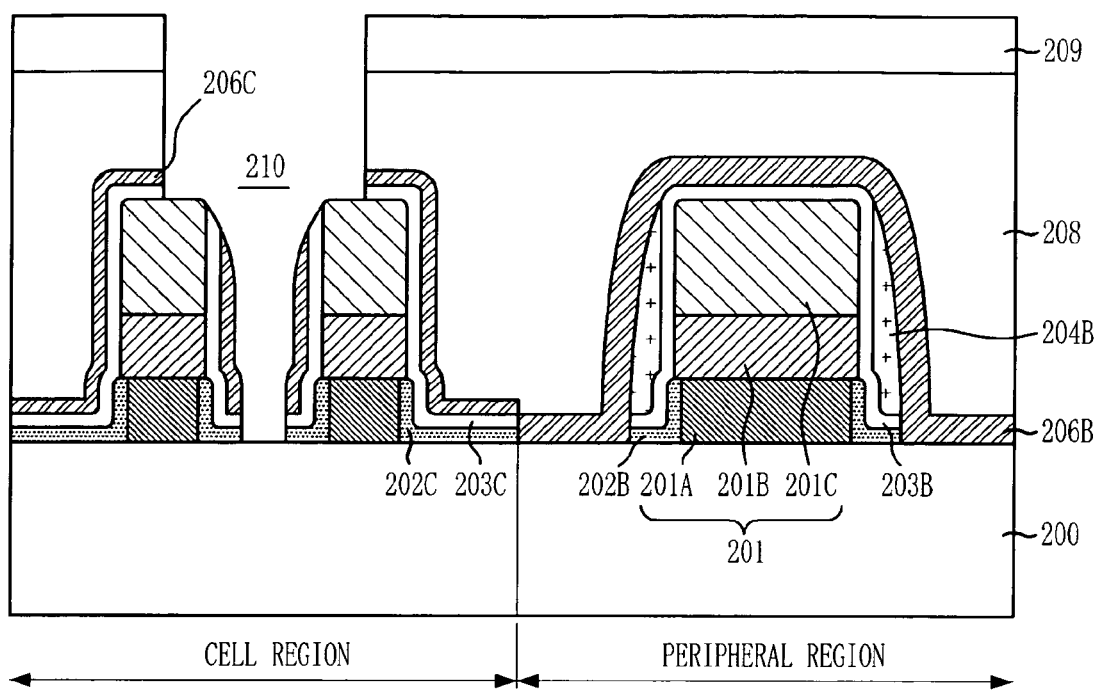

BEFORE ETCH → AFTER ETCH

METHOD FOR FABRICATING SEMICONDUCTOR DEVICE

CROSS-REFERENCE TO RELATED APPLICATIONS

The present invention claims priority of Korean patent application number 10-2007-0057277, filed on Jun. 12, 2007, which is incorporated by reference in its entirety.

BACKGROUND OF THE INVENTION

The present invention relates to a method for fabricating a semiconductor device, and more particularly, to a method for forming an insulation layer in a semiconductor device.

As semiconductor devices have become highly integrated, spaces between gate patterns and line widths of gate patterns have narrowed. Thus, it has become difficult to secure spaces for forming contact openings during a landing plug contact hole process. A space of approximately 30 nm should be secured between gate patterns to maintain a contact opening in consideration of a line width variation during a gate process.

It may be difficult to form an insulation layer between gate patterns using a general deposition method because the space between the gate patterns is small. Thus, a borophosphosilicate glass (BPSG) layer having a sufficient level of gap-fill characteristic is used as the insulation layer. When using the BPSG layer as the insulation layer, a nitride-based layer having a thickness larger than a given thickness is generally needed to reduce impurities penetrating into the substrate.

Therefore, gate spacers for forming spacers on sidewalls of the gate patterns and cell spacers for reducing impurities in the BPSG layer penetrating into the substrate are formed after the formation of the gate patterns. However, applying both of the gate spacers and the cell spacers causes a thickness of the nitride-based layer formed between the gate patterns and over the substrate to become too large. Thus, a contact-not-open event may occur during a subsequent self-aligned contact (SAC) etch process, as denoted with a reference numeral 100 in FIG. 1. That is, due to characteristics of the SAC etch process using a selectivity between oxide and nitride, limitations may arise in etching if the thickness of the nitride-based layer is too large, causing the contact-not-open event to occur.

Forming the gate spacers and the cell spacers on the sidewalls of the gate patterns causes the space between the gate patterns to further narrow. Consequently, the gap-fill characteristic may be deteriorated when forming the insulation layer.

SUMMARY OF THE INVENTION

Embodiments of the present invention are directed to provide a method for fabricating a semiconductor device, which can reduce penetration of impurities while forming an insulation layer and secure a gap-fill characteristic. Other embodiments of the present invention are directed to provide a method for fabricating a semiconductor device which can decrease a contact-not-open event when forming a contact hole.

In accordance with an aspect of the present invention, there is provided a method for fabricating a semiconductor device, including: forming at least one gate pattern over a substrate; forming a first insulation layer over the gate patterns and the substrate; etching the first insulation layer in a peripheral region to form at least one gate pattern spacer in the peripheral region; forming a second insulation layer over the substrate structure; etching the second insulation layer in a cell region to a given thickness; forming an insulation structure over the substrate structure; and etching the insulation structure, the etched first insulation layer and second insulation layer in the cell region to form a contact hole.

In accordance with another aspect of the present invention, there is provided a method for fabricating a semiconductor device, including: forming at least one gate pattern over a substrate; forming a first insulation layer over the at least one gate pattern and the substrate; etching the first insulation layer in a peripheral region to form at least one gate pattern spacer in the peripheral region; removing the first insulation layer in a cell region; forming a second insulation layer over the substrate structure; forming an insulation structure over the substrate structure; and etching the insulation structure and the second insulation layer in the cell region to form a contact hole.

BRIEF DESCRIPTION OF THE DRAWINGS

FIGS. 2A to 2G illustrate cross-sectional views of a method for fabricating a semiconductor device in accordance with a first embodiment of the present invention.

DESCRIPTION OF SPECIFIC EMBODIMENTS

Embodiments of the present invention relate to a method for fabricating a semiconductor device.

FIGS. 2A to 2G illustrate cross-sectional views of a method for fabricating a semiconductor device in accordance with a first embodiment of the present invention.

Figure 1:
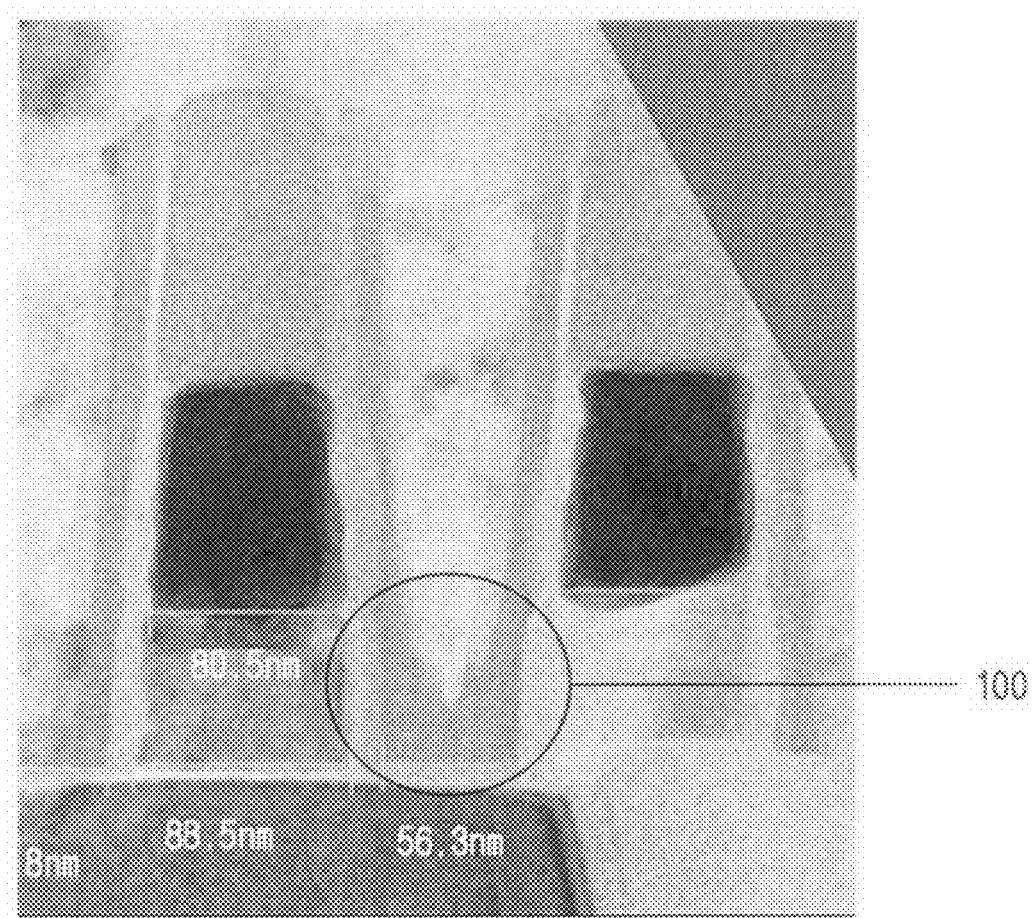
FIG. 1 illustrates a micrographic view showing a limitation of a typical technology.
Figure 2A:
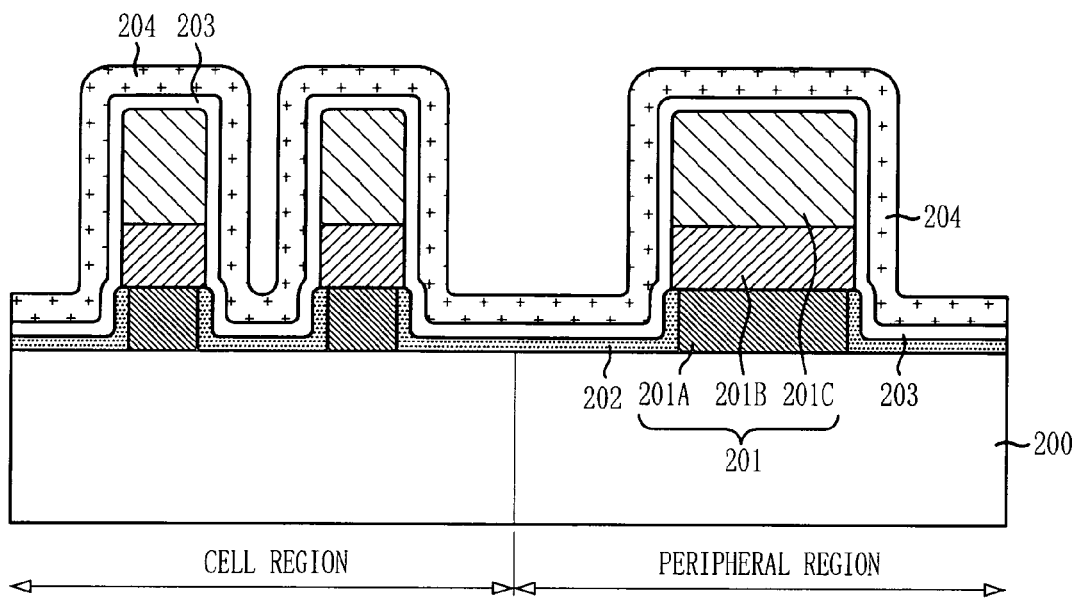

Referring to FIG. 2A, gate patterns 201 are formed over a substrate 200 including a cell region and a peripheral region. The substrate 200 may include a semiconductive substrate on which a dynamic random access memory (DRAM) process is performed. Each gate pattern 201 includes a stack structure configured with a polysilicon electrode 201A, a metal-based electrode 201B, and a gate hard mask 201C. The metal-based electrodes 201B may include metal or metal silicide. For instance, the metal includes tungsten and the metal silicide includes tungsten silicide. The gate hard masks 201C may include a nitride-based layer.

A gate reoxidation process is performed to round edges of the gate patterns 201 such that gate induced drain leakage (GIDL) is reduced, deterioration by hot electrons is decreased, and layers damaged while forming the gate patterns 201 are compensated. A capping passivation layer may be formed on sidewalls of the gate patterns 201 prior to performing the gate reoxidation process to reduce abnormal oxidation of the metal-based electrodes 201B and interfacial oxidation between the metal-based electrodes 201B and the polysilicon electrodes 201A. The gate reoxidation process is performed to form first oxide-based layers 202 over sidewalls of the polysilicon electrodes 201A and over the substrate 200.

A gate spacer layer is formed as a first insulation layer over the resultant structure. The gate spacer layer is formed to protect the first oxide-based layers 202 during subsequent processes such as a wet cleaning process and to form sidewall passivation layers on the gate patterns 201 in the peripheral region. The gate spacer layer includes a stack structure configured with a nitride-based layer 203 and a second oxide-based layer 204. The gate spacer layer is formed to a thickness ranging from approximately 5 Å to approximately 150 Å.

Figure 2B:
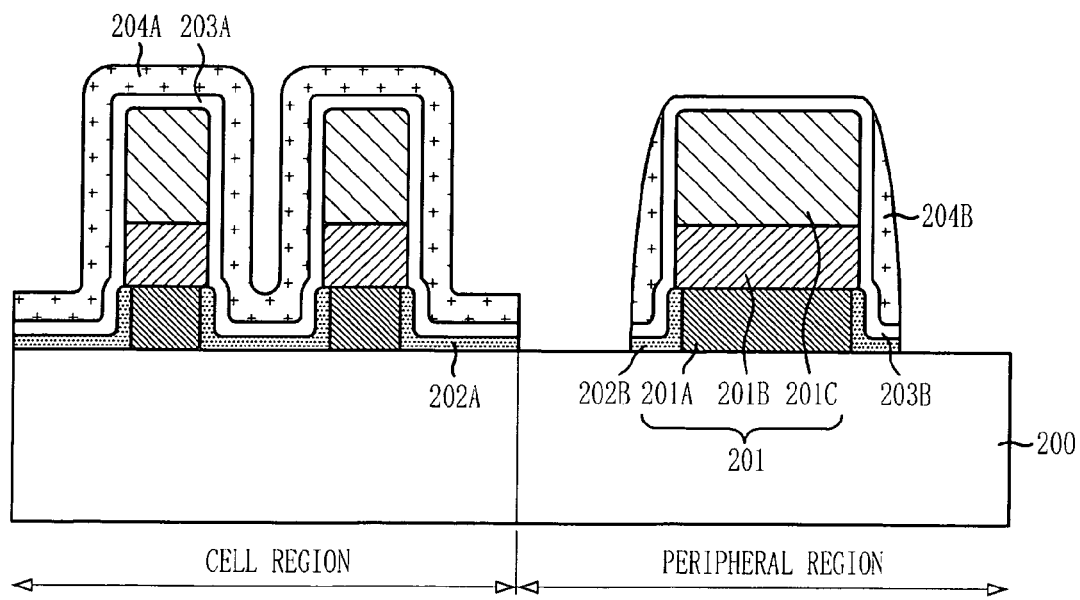

Referring to FIG. 2B, portions of the gate spacer layer in the peripheral region are etched to form sidewall passivation layers functioning as gate pattern spacers. The gate spacer layer may be etched using an etch-back process. A photoresist pattern exposing the peripheral region may be formed over the gate spacer layer in the cell region prior to etching the gate spacer layer in the peripheral region.

A portion of the gate spacer layer formed over the gate patterns 201 and the substrate 200 in the cell region remains after the portions of the gate spacer layer in the peripheral region are etched. Thus, a gate spacer including a stack structure configured with a patterned nitride-based layer 203A and a patterned second oxide-based layer 204A is formed in the cell region. The patterned nitride-based layer 203A and the patterned second oxide-based layer 204A are referred to as the first nitride pattern 203A and the second cell oxide pattern 204A for convenience of description hereinafter. Portions of the gate spacer layer in the peripheral region remain over sidewalls of the gate pattern 201, thereby forming the sidewall passivation layers including another patterned nitride-based layer 203B and another patterned second oxide-based layer 204B. Thus, the substrate 200 in the peripheral region is exposed. The other patterned nitride-based layer 203B and the other patterned second oxide-based layer 204B are referred to as the second nitride pattern 203B and the second peripheral oxide pattern 204B for convenience of description hereinafter. Reference numerals 202A and 202B refer to patterned first oxide-based layers 202A in the cell region and other patterned first oxide-based layers 202B in the peripheral region. The patterned first oxide-based layers 202A and the other patterned first oxide-based layers 202B are referred to as the first cell oxide pattern 202A and the first peripheral oxide pattern 202B hereinafter.

Figure 2C:
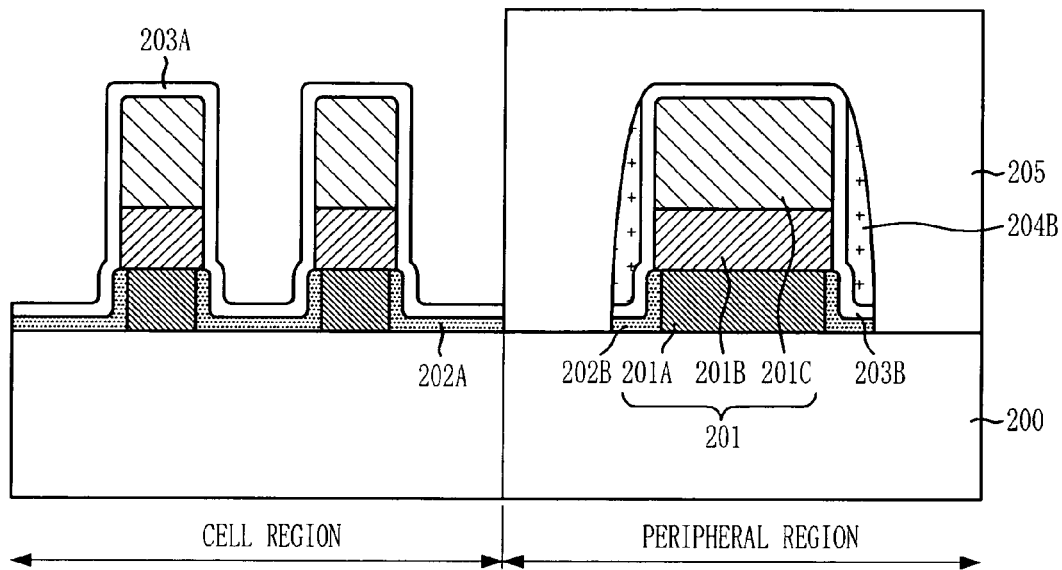

Referring to FIG. 2C, a first mask pattern 205 is formed in the peripheral region. The first mask pattern 205 is formed by forming a photoresist layer over the cell region and the peripheral region of the substrate structure, and performing a photo-exposure and developing process to expose the cell region.

The second cell oxide pattern 204A in the cell region is removed. For instance, the second cell oxide pattern 204A is removed using wet etch. The wet etch is performed using hydrogen fluoride (HF) or buffered oxide etchant (BOE). Thus, the first nitride pattern 203A remains in the cell region. The first nitride pattern 203A is formed to a thickness ranging from approximately 50 Å to approximately 70 Å.

Figure 2D:
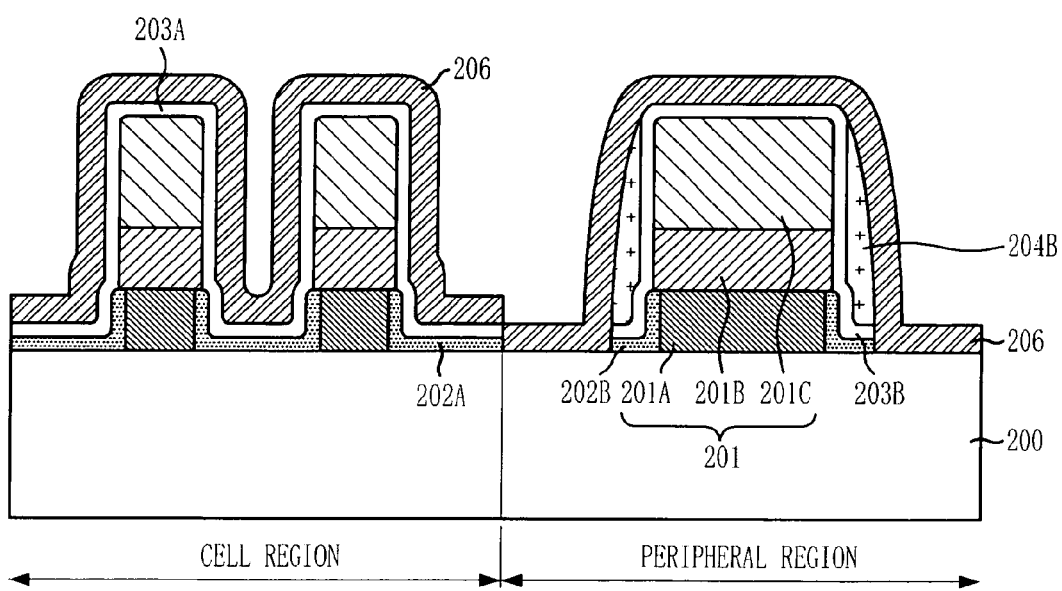

Referring to FIG. 2D, the first mask pattern 205 is removed. The first mask pattern 205 may be removed using an oxygen removal process if the first mask pattern 205 includes photoresist. A cell spacer layer 206 is formed as a second insulation layer over the cell region and the peripheral region of the substrate structure. The cell spacer layer 206 is formed to reduce impurities penetrating into the substrate 200 while forming a subsequent insulation layer. The cell spacer layer 206 is formed to a thickness ranging from approximately 70 Å to approximately 200 Å, desirably from approximately 140 Å to approximately 200 Å. The cell spacer layer 206 may include one selected from a group consisting of a nitride-based layer such as silicon nitride (SiN), SiCN, SiC, and SiBN.

After the cell spacer layer 206 is formed, the cell spacer layer 206 exists in the peripheral region, and the first nitride pattern 203A and the cell spacer layer 206 exist in the cell region. That is, the total thickness of nitride in the cell region increases due to the cell spacer layer 206 and the first nitride pattern 203A. Although the first cell oxide pattern 202A is formed below the first nitride pattern 203A, the first cell oxide pattern 202A may not affect a gap-fill margin when forming a subsequent insulation layer because the first cell oxide pattern 202A exists over the substrate 200. Furthermore, the first cell oxide pattern 202A is easily etched by an oxide etch gas during a subsequent self-aligned contact etch, thus may not cause a contact-not-open event.

Figure 2E:
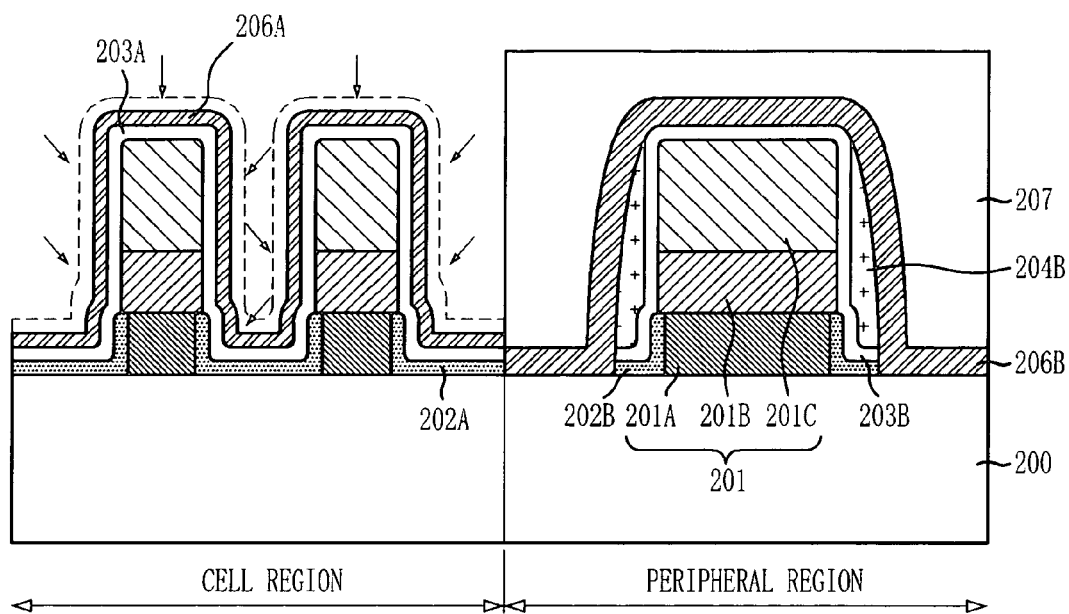

Referring to FIG. 2E, a second mask pattern 207 is formed over the cell spacer layer 206 in the peripheral region. The second mask pattern 207 is formed by forming a photoresist layer over the cell spacer layer 206 in the cell region and the peripheral region, and performing a photo-exposure and developing process to expose the cell region.

The cell spacer layer 206 in the cell region is etched to a given thickness. An isotropic etch process may be used to etch the cell spacer layer 206 to secure a space between the gate patterns 201. The isotropic etch process may be performed wet or dry. Hereinafter, a remaining portion of the cell spacer layer 206 in the cell region is referred to as a cell spacer pattern 206A, and a non-etched portion of the cell spacer layer 206 in the peripheral region is referred to as a remaining cell spacer 206B.

The dry etch is performed in an apparatus selected from a group consisting of a reactive ion beam etching (RIE) apparatus, a magnetically enhanced RIE (MERIE) apparatus, an inductively coupled plasma (ICP) apparatus, and an electron cyclotron resonance (ECR) apparatus, using a top power ranging from approximately 100 W to approximately 4,000 W at a pressure ranging from approximately 2 mT to approximately 500 mT, without supplying a bottom power. The bottom power is not supplied because supplying the bottom power may result in energy pulling toward the substrate 200, and thus cause straightness. Consequently, difficulty may arise in performing the isotropic etch.

The dry etch uses a gas for etching nitride as a main gas to induce chemical etch rather than physical etch. The gas includes one selected from a group consisting of a CHF-based, CF-based, SF-based, NF-based, CH-based gas, and a combination thereof. For instance, the CHF-based gas includes one of $CHF_3$ and $CH_3F$, the CF-based gas includes one of $CF_4$, $C_2F_6$, and $C_2F_4$, the SF-based gas includes $SF_4$, the NF-based gas includes $NF_3$, and the CH-based gas includes $CH_3$. The dry etch may be performed using the main gas and adding one selected from a group consisting of argon (Ar), oxygen ($O_2$), helium (He), nitrogen (N), and a combination thereof.

The wet etch is performed using a BOE. Although the BOE is typically used to etch oxide, the BOE is used to etch the cell spacer layer 206 including nitride in this embodiment. Performing the wet etch using the BOE obtains increased thickness uniformity of the cell spacer pattern 206A.

By performing the dry or wet etch, the minimum thickness remains for reducing impurities of a subsequent insulation layer penetrating into the substrate 200. For instance, if the first nitride pattern 203A has a thickness of approximately 50 Å and the cell spacer layer 206 has a thickness of approximately 140 Å, the total thickness of nitride is approximately 190 Å. Thus, approximately 50 Å is etched to match the minimum thickness of approximately 140 Å needed to reduce impurities penetrating into the substrate 200.

The total thickness of the cell spacer pattern 206A and the first nitride pattern 203A may range between the minimum thickness which can reduce impurity penetration during a subsequent insulation layer formation and the maximum thickness which can secure the contact hole margin. For instance, the total thickness ranges from approximately 40 Å approximately 200 Å.

In particular, the remaining cell spacer 206B remains not etched in the peripheral region while forming the cell spacer pattern 206A. This result is obtained because the photoresist layer used as the second mask pattern 207 has a high etch rate to the gas and the solution used during the dry and wet etch for etching oxide.

Figure 2F:
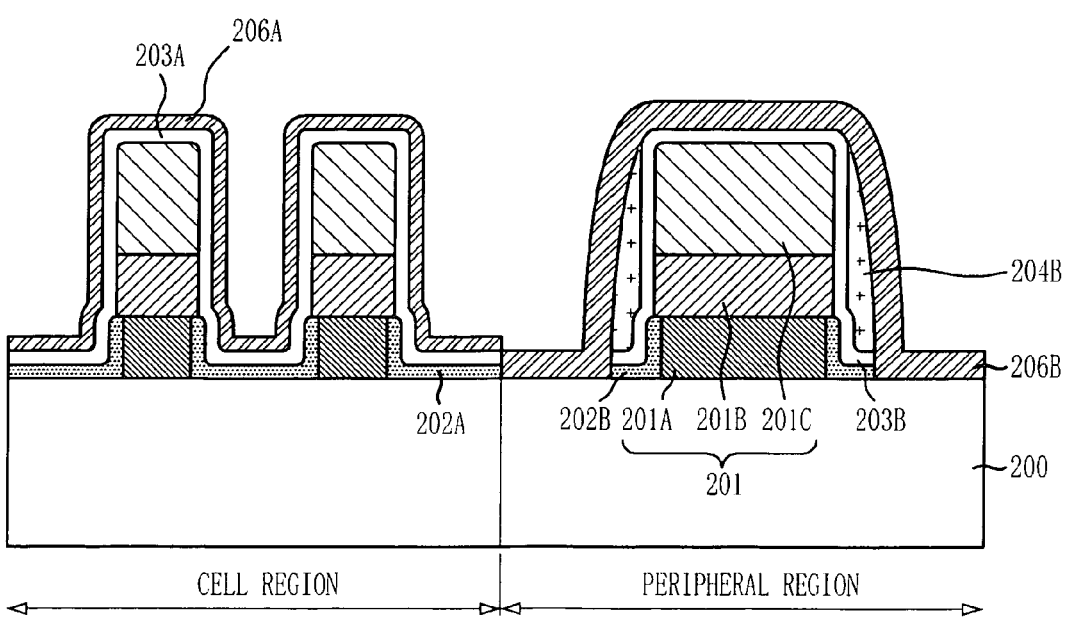

Referring to FIG. 2F, the second mask pattern 207 is removed. The second mask pattern 207 may be removed using an oxygen removal process.

Referring to FIG. 2G, an insulation layer is formed over the cell spacer pattern 206A and the remaining cell spacer 206B. The insulation layer is formed in a manner to sufficiently fill spaces between the gate patterns 201. For instance, the insulation layer includes a borophosphosilicate glass (BPSG) layer having a sufficient level of gap-fill characteristic to fill the narrow spaces between the gate patterns 201. The gap-fill margin is further secured because a given thickness of the cell spacer layer 206 in the cell region is etched to secure the space between the gate patterns 201 as shown in FIG. 2D.

A wet thermal treatment is performed. The wet thermal treatment is performed to out-diffuse impurities in the BPSG layer such that the BPSG layer is transformed into an oxide-based layer providing insulation between the layers. The impurities such as boron from the BPSG layer may not penetrate into the substrate 200 because the cell spacer pattern 206A, the remaining cell spacer 206B, and the first nitride pattern 203A below the insulation layer are formed to the minimum thickness or greater for reducing the impurity penetration.

A third mask pattern 209 is formed over the insulation layer. For instance, the third mask pattern 209 includes a photoresist layer. Also, a hard mask may be additionally formed to secure an etch margin. If the third mask pattern 209 includes a photoresist pattern, the third mask pattern 209 is formed by forming a photoresist layer over the insulation layer and performing a photo-exposure and developing process to pattern the photoresist pattern. If the hard mask is additionally formed, the hard mask is formed by: forming a hard mask layer over the insulation layer, forming a photoresist layer over the hard mask layer, performing a photo-exposure and developing process to pattern the photoresist layer, and etching the hard mask layer using the patterned photoresist layer as an etch mask.

The insulation layer in the cell region, the cell spacer pattern 206A, and the first nitride pattern 203A are etched to form a contact hole 210 exposing the substrate 200 between the gate patterns 201. Reference numerals 202C, 203C, 206C, and 208 represent a remaining first cell oxide pattern 202C, a remaining first nitride pattern 203C, a remaining cell spacer pattern 206C and an insulation pattern 208.

For instance, the contact hole 210 is formed using a self-aligned contact (SAC) etch process. The SAC etch process is performed to decrease the difficulty in etching the small space between the gate patterns 201. The SAC etch process uses a selectivity between nitride and oxide. The etch margin is secured because the total thickness of the cell spacer pattern 206A and the first nitride pattern 203A ranges between the minimum thickness which can reduce impurity penetration and the maximum thickness which can secure the contact hole margin, preventing a contact-not-open event. A subsequent process may be performed to form a landing plug contact by forming a conductive material in the contact hole 210 and planarizing the conductive material.

FIGS. 3A to 3F illustrate cross-sectional views of a method for fabricating a semiconductor device in accordance with a second embodiment of the present invention.

Figure 3A:
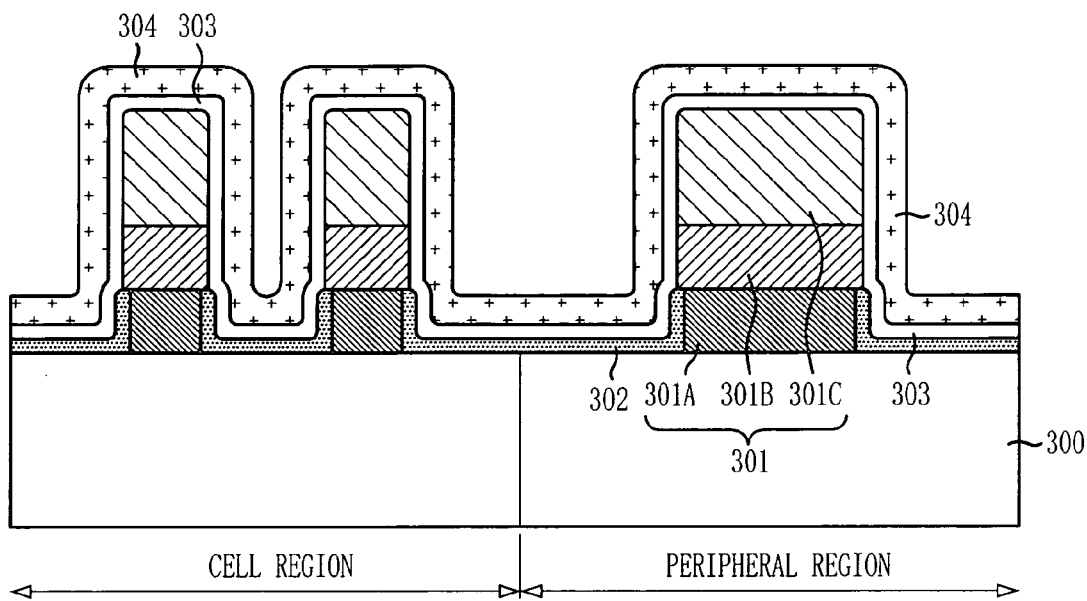
FIGS. 3A to 3F illustrate cross-sectional views of a method for fabricating a semiconductor device in accordance with a second embodiment of the present invention.

Referring to FIG. 3A, gate patterns 301 are formed over a substrate 300 including a cell region and a peripheral region. The substrate 300 may include a semiconductive substrate on which a DRAM process is performed. Each gate pattern 301 includes a stack structure configured with a polysilicon electrode 301A, a metal-based electrode 301B, and a gate hard mask 301C. The metal-based electrode 301B may include metal or metal silicide. For instance, the metal includes tungsten and the metal silicide includes tungsten silicide. The gate hard mask 301C may include a nitride-based layer.

A gate reoxidation process is performed to round edges of the gate patterns 301 such that GIDL is reduced, deterioration by hot electrons is decreased, and layers damaged while forming the gate patterns 301 are compensated. A capping passivation layer may be formed on sidewalls of the gate patterns 301 prior to performing the gate reoxidation process to reduce abnormal oxidation of the metal-based electrodes 301B and interfacial oxidation between the metal-based electrodes 301B and the polysilicon electrodes 301A. The gate reoxidation process is performed to form first oxide-based layers 302 over sidewalls of the polysilicon electrodes 301A and over the substrate 300.

A gate spacer layer is formed as a first insulation layer over the resultant structure. The gate spacer layer is formed to protect the first oxide-based layers 302 during subsequent processes such as a wet cleaning process and to form sidewall passivation layers on the gate patterns 301 in the peripheral region. The gate spacer layer includes a stack structure configured with a nitride-based layer 303 and a second oxide-based layer 304. The gate spacer layer is formed to a thickness ranging from approximately 5 Å to approximately 150 Å.

Figure 3B:
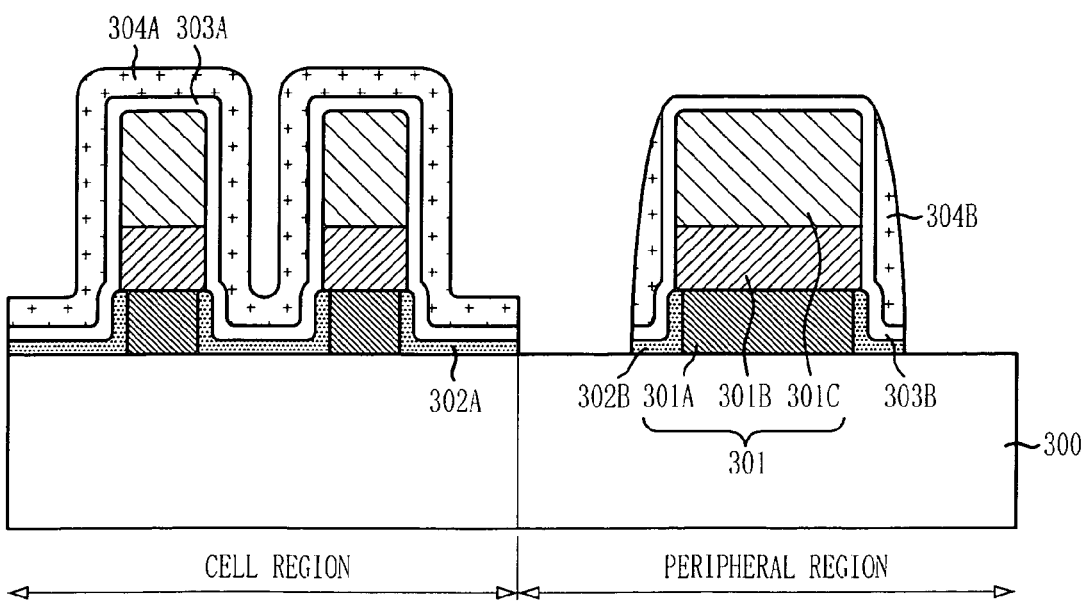

Referring to FIG. 3B, portions of the gate spacer layer in the peripheral region is etched to form sidewall passivation layers functioning as gate pattern spacers. The gate spacer layer may be etched using an etch-back process. A photoresist pattern exposing the peripheral region may be formed over the gate spacer layer in the cell region prior to etching the gate spacer layer in the peripheral region.

A portion of the gate spacer layer formed over the gate patterns 301 and the substrate 300 in the cell region remains after the portions of the gate spacer layer in the peripheral region are etched. Thus, a gate spacer including a stack structure configured with a patterned nitride-based layer 303A and a patterned second oxide-based layer 304A is formed in the cell region. The patterned nitride-based layer 303A and the patterned second oxide-based layer 304A are referred to as the first nitride pattern 303A and the second cell oxide pattern 304A for convenience of description hereinafter. Portions of the gate spacer layer in the peripheral region remain over sidewalls of the gate pattern 301, thereby forming the sidewall passivation layers including another patterned nitride-based layer 303B and another patterned second oxide-based layer 304B. Thus, the substrate 300 in the peripheral region is exposed. The other patterned nitride-based layer 303B and the other patterned second oxide-based layer 304B are referred to as the second nitride pattern 303B and the second peripheral oxide pattern 304B for convenience of description hereinafter. Reference numerals 302A and 302B refer to patterned first oxide-based layers 302A in the cell region and other patterned first oxide-based layers 302B in the peripheral region. The patterned first oxide-based layers 302A and the other patterned first oxide-based layers 302B are referred to as the first cell oxide pattern 302A and the first peripheral oxide pattern 302B hereinafter.

Figure 3C:
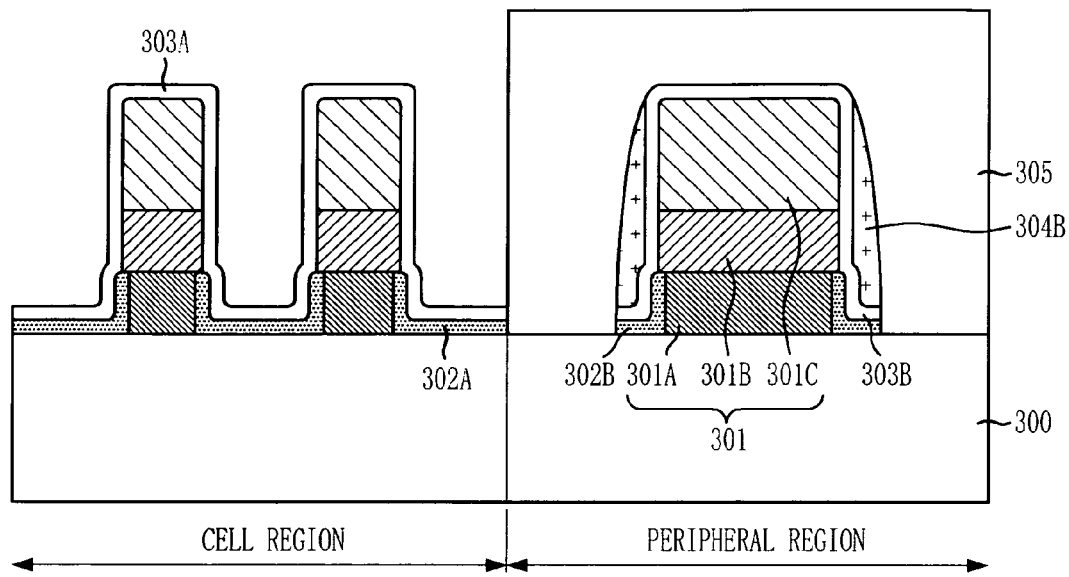

Referring to FIG. 3C, a first mask pattern 305 is formed in the peripheral region. The first mask pattern 305 is formed by forming a photoresist layer over the cell region and the peripheral region of the substrate structure, and performing a photo-exposure and developing process to expose the cell region.

The second cell oxide pattern 304A in the cell region is removed. For instance, the second cell oxide pattern 304A is removed using wet etch. The wet etch is performed using HF or BOE. Thus, the first nitride pattern 303A remains in the cell region. The first nitride pattern 303A is formed to a thickness ranging from approximately 50 Å to approximately 70 Å.

Figure 3D:
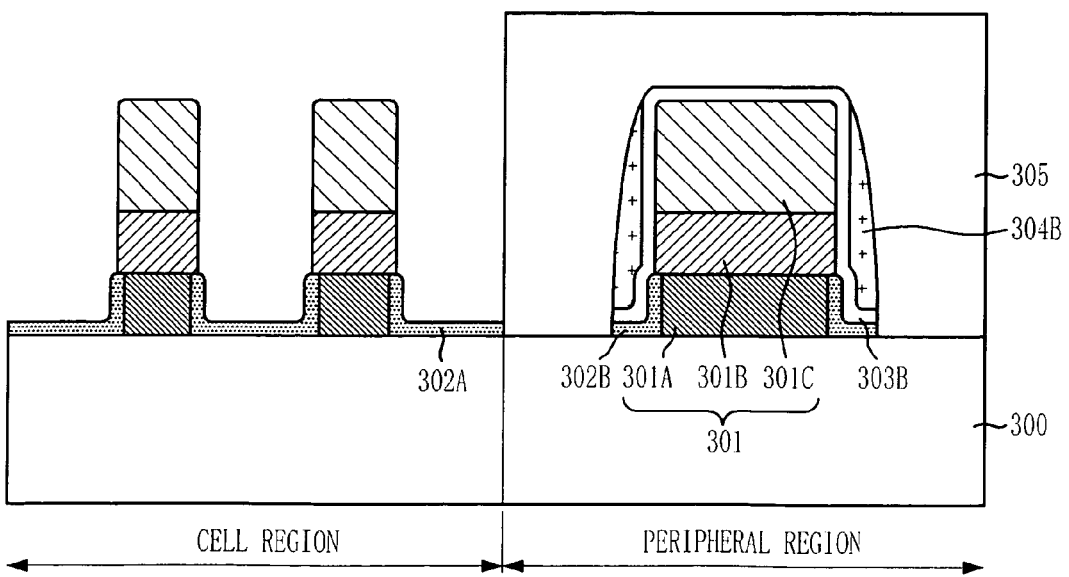

Referring to FIG. 3D, the first nitride pattern 303A is removed. While the second nitride pattern 303B and the second peripheral oxide pattern 304B are formed to configure the sidewall passivation layers in the peripheral region and impurity penetration during a subsequent insulation layer formation may be prevented using a cell spacer, the first nitride pattern 303A may be no longer necessary. Thus, the first nitride pattern 303A is removed in advance. The first nitride pattern 303A is removed using an isotropic etch. For instance, the isotropic etch includes a dry etch.

The dry etch is performed in an apparatus selected from a group consisting of a RIE apparatus, a MERIE apparatus, an ICP apparatus, and an ECR apparatus, using a top power ranging from approximately 100 W to approximately 4,000 W at a pressure ranging from approximately 2 mT to approximately 500 mT, without supplying a bottom power. The bottom power is not supplied because supplying the bottom power may result in energy pulling toward the substrate 300, and thus cause straightness. Consequently, difficulty may arise in performing the isotropic etch.

The dry etch uses a gas for etching nitride as a main gas to induce chemical etch rather than physical etch. The gas includes one selected from a group consisting of a CHF-based, CF-based, SF-based, NF-based, CH-based gas, and a combination thereof. For instance, the CHF-based gas includes one of $CHF_3$ and $CH_3F$, the CF-based gas includes one of $CF_4$, $C_2F_6$, and $C_2F_4$, the SF-based gas includes $SF_4$, the NF-based gas includes $NF_3$, and the CH-based gas includes $CH_3$. The dry etch may be performed using the main gas and adding one selected from a group consisting of Ar, $O_2$, He, N, and a combination thereof.

Although a uniform etching may be obtained by performing a wet etch using BOE, the dry etch is used to remove the first nitride pattern 303A to prevent the first cell oxide pattern 302A from getting removed by the gate reoxidation process.

The first cell oxide pattern 302A remains over the substrate 300 in the cell region after removing the first nitride pattern 303A. The sidewall passivation layers in the peripheral region are protected by the first mask pattern 305 from damage while removing the first nitride pattern 303A and the second cell oxide pattern 304A.

Figure 3E:
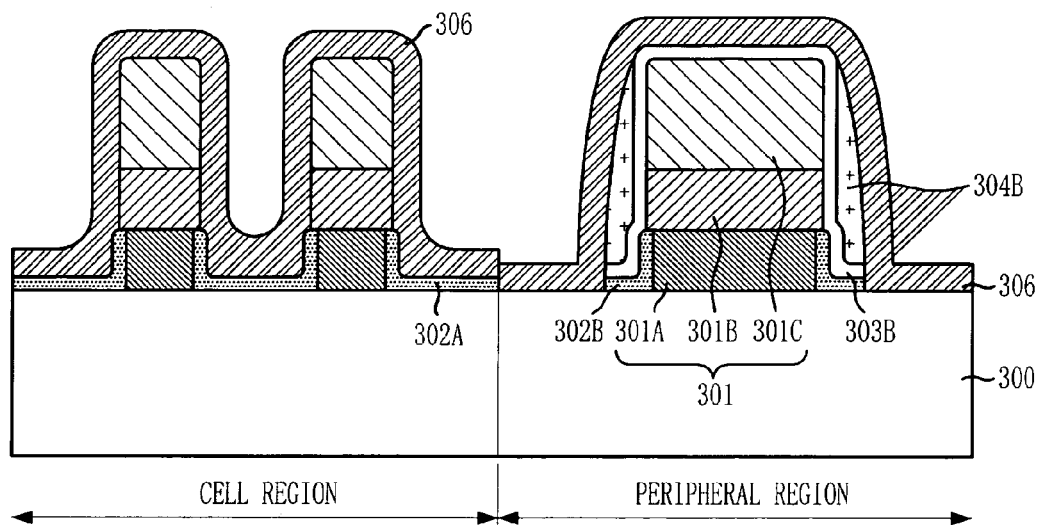

Referring to FIG. 3E, the first mask pattern 305 is removed. If the first mask pattern 305 includes photoresist, the first mask pattern 305 may be removed using an oxygen removal process.

A cell spacer 306 is formed as a second insulation layer over the cell region and the peripheral region of the substrate structure. The cell spacer 306 is formed to reduce impurities penetrating into the substrate 300 while forming a subsequent insulation layer. The cell spacer 306 is formed to a thickness ranging between the minimum thickness which can reduce impurity penetration during a subsequent insulation layer formation and the maximum thickness which can secure the contact hole margin. For instance, the cell spacer 306 is formed to a thickness ranging from approximately 70 Å to approximately 200 Å, desirably from approximately 140 Å to approximately 200 Å. The cell spacer 306 may include one selected from a group consisting of a nitride-based layer such as silicon nitride (SiN), SiCN, SiC, and SiBN.

After the removal of the first nitride pattern 303A and the second cell oxide pattern 304A as shown in FIGS. 3C and 3D, the cell spacer 306 exists over the substrate structure in both cell and peripheral regions. Although the first cell oxide pattern 302A exists under the cell spacer 306 in the cell region, the first cell oxide pattern 302A may not affect the gap-fill margin during a subsequent insulation layer formation because the first cell oxide pattern 302A exists on the substrate 300. Also, the first cell oxide pattern 302A may be easily etched by an oxide etch gas during a subsequent SAC etch, thus may not result in a contact-not-open event.

Using the first mask pattern 305, which is formed to remove the second cell oxide pattern 304A, to remove the first nitride pattern 303A allows omitting additional mask pattern formation and removal processes, securing a process margin. Also, removing the first nitride pattern 303A and the second cell oxide pattern 304A before forming the cell spacer 306 allows securing the minimum thickness which can reduce impurity penetration of a subsequent insulation layer and spaces between the gate patterns 301.

Figure 3F:
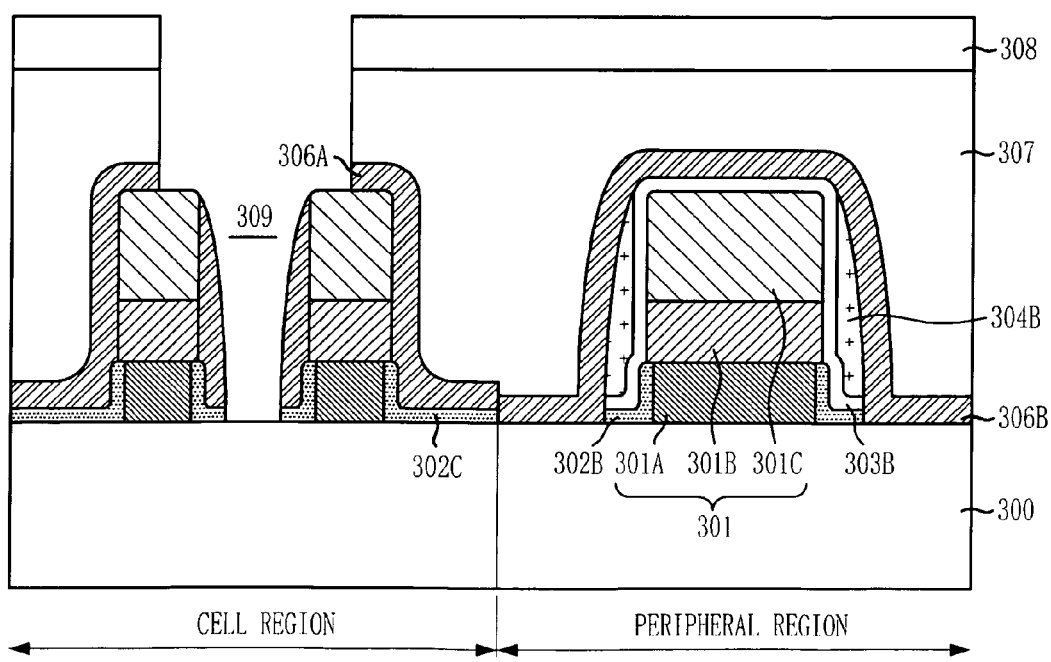

Referring to FIG. 3F, an insulation layer is formed over the cell spacer 306. The insulation layer is formed in a manner to sufficiently fill the spaces between the gate patterns 301. For instance, the insulation layer includes a BPSG layer having a sufficient level of gap-fill characteristic to fill the narrow spaces between the gate patterns 301. The gap-fill margin is further secured because the cell spacer 306 is formed after removing the first nitride pattern 303A to secure the space between the gate patterns 301 as shown in FIG. 3D.

A wet thermal treatment is performed. The wet thermal treatment is performed to out-diffuse impurities in the BPSG layer such that the BPSG layer is transformed into an oxide-based layer providing insulation between the layers. The out-diffusion is possible without impurities such as boron from the BPSG layer penetrating into the substrate 300 during the wet thermal treatment because the cell spacer 306 below the insulation layer is formed to the minimum thickness for reducing the impurity penetration.

A second mask pattern 308 is formed over the insulation layer. For instance, the second mask pattern 308 includes a photoresist layer. Also, a hard mask may be additionally formed to secure an etch margin. If the second mask pattern 308 includes a photoresist pattern, the second mask pattern 308 is formed by forming a photoresist layer over the insulation layer and performing a photo-exposure and developing process to pattern the photoresist pattern. If the hard mask is additionally formed, the hard mask is formed by: forming a hard mask layer over the insulation layer, forming a photoresist layer over the hard mask layer, performing a photo-exposure and developing process to pattern the photoresist layer, and etching the hard mask layer using the patterned photoresist layer as an etch mask.

The insulation layer and the cell spacer 306 in the cell region are etched to form a contact hole 309 exposing the substrate 300 between the gate patterns 301. Reference numerals 302C, 306A, 306B, and 307 represent a remaining first cell oxide pattern 302C, a patterned cell spacer 306A in the cell region, a remaining cell spacer 306B in the peripheral region, and an insulation pattern 307.

For instance, the contact hole 309 is formed using a SAC etch process. The SAC etch process is performed to decrease the difficulty in etching the small space between the gate patterns 301. The SAC etch process uses a selectivity between nitride and oxide. The etch margin is secured because the thickness of the cell spacer 306 over the substrate 300 in the cell region ranges between the minimum thickness which can reduce impurity penetration and the maximum thickness which can secure the contact hole margin, preventing a contact-not-open event. A subsequent process may be performed to form a landing plug contact by forming a conductive material in the contact hole 309 and planarizing the conductive material.

Figure 4:
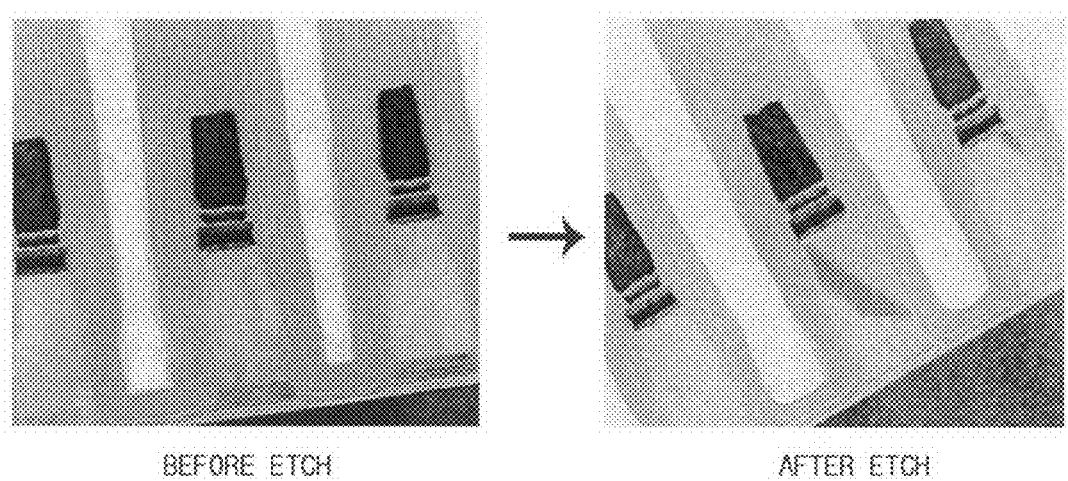
FIG. 4 illustrates micrographic views according to the first and second embodiments of the present invention.

FIG. 4 illustrates micrographic views of a nitride-based layer functioning as a cell spacer in a substrate structure, which is etched using a wet etch. The nitride-based layer is wet etched for approximately 200 seconds. The nitride-based layer has a sidewall thickness of approximately 126 Å and a bottom portion thickness of approximately 123 Å before performing the wet etch. After performing the wet etch for approximately 200 seconds, approximately 37 Å of the sidewalls and approximately 40 Å of the bottom portion may be etched, resulting in a sidewall thickness of approximately 89 Å and a bottom portion thickness of approximately 83 Å. Although not illustrated, if the wet etch is performed for approximately 250 seconds, approximately 42 Å of the sidewalls and approximately 45 Å of the bottom portion may be etched, resulting in a sidewall thickness of approximately 84 Å and a bottom portion thickness of approximately 78 Å.

If the wet etch is performed using BOE, a cell spacer may be etched to remain with a uniform thickness even when the etch time is lengthened. Thus, spaces between gate patterns may be secured and the cell spacer may remain over the substrate with the needed uniform thickness.

In accordance with the embodiments of the present invention, the gate spacer formed over the gate patterns is removed prior to forming the cell spacer, or an isotropic etch is performed to selectively etch a given thickness of the cell spacer in the cell region after forming the gate to spacer and the cell spacer, to secure spaces between the gate patterns, thus securing the gap-fill margin when forming the insulation layer.

Furthermore, a stack structure including the gate spacer and the cell spacer, or the cell spacer, remains in the minimum thickness which can secure spaces between the gate patterns and reduce the impurity penetration into the substrate during the insulation layer formation. Thus, the impurity penetration into the substrate by the out-diffusion of the impurities when using a BPSG layer may be sufficiently reduced, and a contact-not-open event during the SAC etch process may be decreased.

Although the embodiments of the present invention defined the cell region and the peripheral region in the description, the embodiments of the present invention can be applied in semiconductor devices in which gate patterns are formed with different density, besides the cell region and the peripheral region. Also, although the embodiments of the present invention described the insulation layer to include a BPSG layer, the insulation layer may include a spin on dielectric (SOD) layer besides the BPSG layer.

In accordance with the embodiments of the present invention, the method for fabricating the semiconductor device maintains the spaces between the gate patterns to secure the gap-fill margin during the insulation layer formation and reduce the contact-not-open event. Also, the impurity penetration from the insulation layer into the substrate is reduced, forming a reliable device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming at least one gate pattern over a substrate where a cell region and a peripheral region are defined;
    forming a first insulation layer over the at least one gate pattern and the substrate in the cell region and the peripheral region;
    etching the first insulation layer only in the peripheral region to form at least one gate pattern spacer in the peripheral region, thereby forming a first resultant structure;
    forming a second insulation layer over the first resultant structure in the cell region and the peripheral region;
    etching a portion of the second insulation layer only in the cell region, thereby forming a second resultant structure;
    forming an insulation structure over the second resultant structure in the cell region and the peripheral region; and
    etching the insulation structure, the second resultant structure and the first insulation layer only in the cell region until exposing the gate patterns to form a contact hole;
    wherein etching a portion of the second insulation layer only in the cell region comprises etching the second insulation layer in a manner that a total thickness of the first insulation layer and the etched second insulation layer in the cell region ranges between a minimum thickness which reduces impurity penetration while forming the insulation structure and a maximum thickness which secures a contact hole margin.

2. The method of claim 1, wherein the first insulation layer comprises a nitride-based layer or a stack structure configured with a nitride-based layer and an oxide-based layer.

3. The method of claim 2, further comprising, if the first insulation layer comprises the stack structure configured with the nitride-based layer and the oxide-based layer, removing the nitride-based layer after forming the at least one gate pattern spacer.

4. The method of claim 1, wherein the second insulation layer comprises a nitride-based layer.

5. The method of claim 4, wherein the second insulation layer is formed to a thickness ranging from approximately 70 Å to approximately 200 Å.

6. The method of claim 4, wherein the nitride-based layer comprises at least one of silicon nitride (SiN), SiCN, SiC and SiBN.

7. The method of claim 1, wherein etching a portion of the second insulation layer only in the cell region comprises etching the second insulation layer in a manner that the total thickness of the first insulation layer and the etched second insulation layer in the cell region ranges from approximately 40 Å to approximately 200 Å.

8. The method of claim 1, wherein etching a portion of the second insulation layer only in the cell region comprises performing a wet etch that uses a buffered oxide etchant (BOE).

9. The method of claim 1, wherein etching a portion of the second insulation layer only in the cell region comprises performing a dry etch in an apparatus selected from a group consisting of a reactive ion beam etching (RIE) apparatus, a magnetically enhanced RIE (MERIE) apparatus, an inductively coupled plasma (ICP) apparatus, and an electron cyclotron resonance (ECR) apparatus, using a top power ranging from approximately 100 W to approximately 4,000 W at a pressure ranging from approximately 2 mT to approximately 500 mT, without supplying a bottom power.

10. The method of claim 9, wherein the dry etch uses a main gas comprising one selected from a group consisting of a CHF-based, CF-based, SF-based, NE-based, CH-based gas and a combination thereof.

11. The method of claim 10, wherein the CHF-based gas comprises one of $CHF_3$ and $CH_3F$, the CF-based gas comprises one of $CF_4$, $C_2F_6$, and $C_2F_4$, the SF-based gas comprises $SF_4$, the NF-based gas comprises $NF_3$, and the CH-based gas comprises $CH_3$.

12. The method of claim 11, wherein the dry etch comprises adding one selected from a group consisting of argon (Ar), oxygen ($O_2$), helium (He), nitrogen (N), and a combination thereof, to the main gas.

13. The method of claim 1, wherein etching a portion of the second insulation layer only in the cell region comprises:
    forming a photoresist pattern over the second insulation layer, exposing the cell region; and
    etching a portion of the second insulation layer in the cell region.

14. A method for fabricating a semiconductor device, comprising:
    forming at least one gate pattern over a substrate where a cell region and a peripheral region are defined;
    forming a first insulation layer over the at least one gate pattern and the substrate in the cell region and the peripheral region, the first insulation layer comprises a nitride-based layer or a stack structure configured with a nitride-based layer and an oxide-based layer;
    etching the first insulation layer only in the peripheral region to form at least one gate pattern spacer in the peripheral region;
    removing the first insulation layer only in the cell region to thereby form a first resultant structure;
    forming a second insulation layer over the first resultant structure in the cell region and the peripheral region, thereby forming a second resultant structure;
    forming an insulation structure over the second resultant structure in the cell region and the peripheral region; and
    etching the insulation structure and the resultant structure only in the cell region until exposing the gate patterns to form a contact hole,
    wherein when the first insulation layer comprises a stack structure configured with a nitride-based layer and an oxide-based layer, removing the first insulation layer only in the cell region comprises removing the oxide-based layer and removing the nitride-based layer, separately.

15. The method of claim 14, wherein removing the oxide-based layer comprises performing a wet etch using a hydrogen fluoride (HF) or buffered oxide etchant (BOB).

16. The method of claim 14, wherein removing the nitride-based layer comprises performing an isotropic dry etch in an apparatus selected from a group consisting of a reactive ion beam etching (RIE) apparatus, a magnetically enhanced PIE (MERLE) apparatus, an inductively coupled plasma (ICP) apparatus, and an electron cyclotron resonance (ECR) apparatus, using a top power ranging from approximately 100 W to approximately 4,000 W at a pressure ranging from approximately 2 mT to approximately 500 mT, without supplying a bottom power.

17. The method of claim 16, wherein the dry etch uses a main gas comprising one selected from a group consisting of a CHF-based, CF-based, SF-based, NF-based, CH-based gas and a combination thereof.

18. The method of claim 17, wherein the CHF-based gas comprises one of $CHF_3$ and $CH_3F$, the CF-based gas comprises one of $CF_4$, $C_2F_6$, and $C_2F_4$, the SF-based gas comprises $SF_4$, the NF-based gas comprises $NF_3$, and the CH-based gas comprises $CH_3$.

19. The method of claim 18, wherein the dry etch comprises adding one selected from a group consisting of argon (Ar), oxygen ($O_2$), helium (He), nitrogen (N), and a combination thereof, to the main gas.

20. The method of claim 14, wherein the second insulation layer comprises a nitride-based layer.

21. The method of claim 20, wherein the second insulation layer is formed to a thickness ranging from approximately 140 Å to approximately 200 Å.

22. The method of claim 20, wherein the nitride-based layer comprises at least one of silicon nitride (SiN), SiCN, SiC and SiBN.

* * * * *